United States Patent
Osaki et al.

(10) Patent No.: US 11,195,714 B2
(45) Date of Patent: Dec. 7, 2021

(54) PATTERN-FORMING METHOD

(71) Applicant: JSR CORPORATION, Tokyo (JP)

(72) Inventors: Hitoshi Osaki, Tokyo (JP); Jeffrey Kmiec, Sunnyvale, CA (US)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/922,010

(22) Filed: Jul. 7, 2020

(65) Prior Publication Data

US 2020/0402789 A1 Dec. 24, 2020

Related U.S. Application Data

(63) Continuation of application No. PCT/JP2019/000375, filed on Jan. 9, 2019.

(60) Provisional application No. 62/615,547, filed on Jan. 10, 2018.

(51) Int. Cl.
*H01L 21/02* (2006.01)
*H01L 21/306* (2006.01)

(52) U.S. Cl.
CPC .... *H01L 21/0228* (2013.01); *H01L 21/30604* (2013.01)

(58) Field of Classification Search
None
See application file for complete search history.

(56) References Cited

U.S. PATENT DOCUMENTS

| 9,738,062 B2* | 8/2017 | Buck ................. B05D 7/24 |
| 2010/0291303 A1 | 11/2010 | Abys et al. |
| 2017/0114451 A1 | 4/2017 | Lecordier |
| 2019/0210061 A1* | 7/2019 | Ke .................. H01L 21/02175 |

FOREIGN PATENT DOCUMENTS

| JP | 2003076036 A | 3/2003 |
| JP | 2016025315 A | 2/2016 |
| JP | 2016026269 A | 2/2016 |
| JP | 2017098539 A | 6/2017 |

OTHER PUBLICATIONS

Atsushi Hozumi et al, "Preparation of a Well-Defined Amino-Terminated Self-Assembled Monolayer and Copper Microlines on a Polyimide Substrate Covered with an Oxide Nanoskin", Langmuir, 21, 2005, pp. 8234-8242.

(Continued)

*Primary Examiner* — Roberts P Culbert
(74) *Attorney, Agent, or Firm* — Element IP, PLC

(57) ABSTRACT

A pattern-forming method includes forming a patterned coating film on a part of a surface layer of a base. The surface layer includes regions each of which includes a material that differs from each other. A part of the regions is the part of the surface layer on which the patterned coating film is formed. The patterned coating film includes a first polymer including at an end of a main chain or a side chain thereof a group including a first functional group that is capable of bonding to an atom present in the part of the region. An atom layer is directly or indirectly formed on the surface layer of the base by a vapor deposition, after the forming of the patterned coating film.

18 Claims, 1 Drawing Sheet

(56) References Cited

OTHER PUBLICATIONS

Fatemeh Sadat Minaye Hashemi et al, "Self-Correcting Process for High Quality Patterning by Atomic Layer Deposition", ACS NANO, vol. 9, No. 9, 2015, pp. 8710-8717.
Haeshin Lee et al, "Mussel-Inspired Surface Chemistry for Multifunctional Coatings", Science, 318(5849), 426-430, Oct. 19, 2007, 10 pages.
International Search Report dated Feb. 19, 2019 in PCT/JP2019/000375 (with English translation), 5 pages.
Ming Fang et al, "Area-Selective Atomic Layer Deposition: Conformal Coating, Subnanometer Thickness Control, and Smart Positioning", ACS NANO, vol. 9, No. 9, 2015, pp. 8651-8654.
Written Opinion dated Feb. 19, 2019 in PCT/JP2019/000375 (with English translation), 11 pages.

* cited by examiner

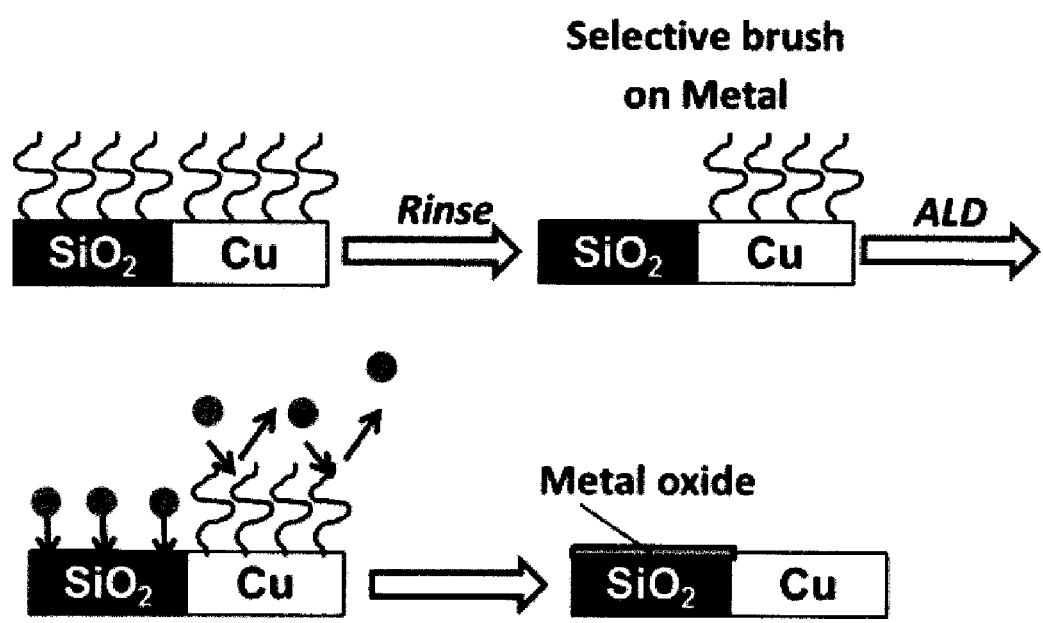

PATTERN-FORMING METHOD

CROSS-REFERENCE TO RELATED APPLICATIONS

The present application is a continuation application of International Application No. PCT/JP2019/000375, filed Jan. 9, 2019, which claims priority to U.S. Provisional Patent Application No. 62/615,547, filed Jan. 10, 2018. The contents of these applications are incorporated herein by reference in their entirety.

BACKGROUND OF THE INVENTION

Field of the Invention

The present invention relates to a pattern-forming method.

Discussion of the Background

Further miniaturization of semiconductor devices has been accompanied by a demand for a technique of forming a fine pattern having a line width of less than 30 nm. However, optical factors and the like have led to technical difficulties for conventional methods employing lithography.

Therefore, a bottom-up technique, as generally referred to, has been contemplated for forming a fine pattern. As the bottom-up technique, in addition to a method employing directed self-assembly of a polymer, a method for selectively modifying a base having a surface layer that includes fine regions has been recently studied. Such a method for selective modification requires a material enabling convenient and highly selective modification of surface regions, and various materials have been investigated for such use (see Japanese Unexamined Patent Application, Publication No. 2016-25315; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

SUMMARY OF THE INVENTION

According to an aspect of the present invention, a pattern-forming method includes forming a patterned coating film on a part of a surface layer of a base. The surface layer includes regions each of which includes a material that differs from each other. A part of the regions is the part of the surface layer on which the patterned coating film is formed. The patterned coating film includes a first polymer including at an end of a main chain or a side chain thereof a group including a first functional group that is capable of bonding to an atom present in the part of the region. An atom layer is directly or indirectly formed on the surface layer of the base by a vapor deposition, after the forming of the patterned coating film.

BRIEF DESCRIPTION OF THE DRAWINGS

The FIGURE is a schematic view illustrating regionally selective forming of an atom layer on a base surface by the pattern-forming method according to the embodiment of the present invention.

DESCRIPTION OF EMBODIMENTS

Recently, surfaces of bases are subjected to pattern deposition through providing an atom layer by thin-film formation using a vapor deposition process, and thus the deposition of the pattern in a highly selective manner with discrimination of the regions has been desired.

However, the materials conventionally proposed are disadvantageous, due to being low molecular materials, in that: application by spin coating in a preexisting process may be impossible and thus a Langmuir-Blodgett process that is low in efficiency needs to be adopted; and heat resistance is inferior. Accordingly, it is preferred to use a polymeric material which has high viscosity and is superior in heat resistant. On the other hand, the polymeric material fails to efficiently modify a base material surface due to involving great steric hindrance According to an embodiment of the invention, a pattern-forming method includes the steps of: providing a base (hereinafter, may be also referred to as "base (X)") having on a surface layer thereof, a plurality of types of regions containing materials that differ from each other (hereinafter, may be also referred to as "base-providing step"); forming on a surface of a part of the regions (hereinafter, may be also referred to as "region (I)" or "regions (I)") on the base (X), a coating film (hereinafter, may be also referred to as "coating film (P)") containing a first polymer (hereinafter, may be also referred to as "(A) polymer" or "polymer (A)") having at an end of a main chain or a side chain thereof a group (hereinafter, may be also referred to as "group (I)") including a first functional group (hereinafter, may be also referred to as "functional group (A)") that is capable of bonding to an atom (hereinafter, may be also referred to as "atom (I)") present on the surface layer of the regions (I) (hereinafter, may be also referred to as "coating film-forming step"); and forming, on the surface of the base (X) after the forming of the coating film, an atom layer (hereinafter, may be also referred to as "atom layer (Y)") by thin-film formation using a vapor deposition procedure (hereinafter, may be also referred to as "atom layer-forming step").

The pattern-forming method of the embodiment of the present invention enables an atom layer to be formed on a base surface conveniently with high regional selectivity. Therefore, the pattern-forming method can be suitably used for working processes of semiconductor devices and the like, in which microfabrication is expected to be further in progress hereafter.

Hereinafter, the pattern-forming method of the embodiment of the invention will be described in detail.

Pattern-Forming Method

The pattern-forming method includes the base-providing step, the coating film-forming step, and the atom layer-forming step.

Due to including each step described above, the pattern-forming method enables an atom layer to be formed on a base surface conveniently with high regional selectivity. Although not necessarily clarified and without wishing to be bound by any theory, the reason for achieving the effects described above due to the pattern-forming method having the constitution described above may be supposed as in the following, for example. To explain specifically, due to using the polymer (A) having at an end of a main chain or a side chain thereof the group (I) including the functional group (A) that is capable of bonding to the atom (I) present on the surface layer of a part of the regions (I) on the base, the pattern-forming method as shown in the FIGURE enables more selective forming, on the surface of the region (I) within a shorter period of time, of a blocking film that inhibits thin-film formation using a vapor deposition procedure in a coating film-forming step, as compared with the case in which the Langmuir-Blodgett process is used by a directed self-assembled monolayer (SAM) in which a low molecular compound such as octadecyl phosphonic acid is used. As a result, by the atom layer-forming step, the atom layer (Y) can be selectively formed on regions (hereinafter, may be also referred to as "region (II)" or "regions (II)") other than the region (I). Accordingly, the pattern-forming method enables the atom layer to be formed on the base surface conveniently with high regional selectivity.

In addition, it is preferred that the pattern-forming method further includes, after the atom layer-forming step, a step (hereinafter, may be also referred to as "etching-removing step") of removing by etching the coating film (P) on the base (X) after the atom layer-forming step, and the atom layer (Y) formed on the surface of the coating film (P).

Hereinafter, each step will be described.

Base-Providing Step

In this step, the base (X) is provided. The base (X) has on the surface layer thereof, a plurality of regions containing materials that differ from each other. The expression that the materials contained in each region "differ from each other" as referred to herein means, for example, that each material can be discriminated from one another in terms of its composition, properties and the like, and that states of the presence of elements in the surface layer are different.

The base (X) has the regions (I) that are a part of a plurality of the regions included on the surface layer, and the region (II) other than the region (I).

The atom (I) present in the surface layer of the region (I) is exemplified by a metal atom (hereinafter, may be also referred to as "metal atom (a)"), a nonmetal atom (hereinafter, may be also referred to as "nonmetal atom (b)"), and the like.

The metal atom (a) is not particularly limited as long as it is an atom of a metal element. Silicon and boron are nonmetals and do not fall under the category of the metal atom (a). Examples of the metal atom (a) include copper, iron, zinc, cobalt, aluminum, tin, tungsten, zirconium, titanium, tantalum, germanium, molybdenum, ruthenium, gold, silver, platinum, palladium, nickel, and the like. Of these, copper, titanium, cobalt, aluminum or tungsten is preferred, and copper is more preferred.

The metal atom (a) may be included in the form of, for example, a metal simple substance, an alloy, an electrically conductive nitride, a metal oxide, a silicide, or the like.

Examples of the metal simple substance include simple substances of metals such as copper, iron, cobalt, tungsten, tantalum, and the like.

Examples of the alloy include a nickel-copper alloy, a cobalt-nickel alloy, a gold-silver alloy, and the like.

Examples of the electric conductive nitride include tantalum nitride, titanium nitride, iron nitride, aluminum nitride, and the like.

Examples of the metal oxide include tantalum oxide, aluminum oxide, iron oxide, copper oxide, and the like.

Examples of the silicide include iron silicide, molybdenum silicide, and the like.

Of these, the metal simple substances are preferred, and the copper simple substance is more preferred.

The nonmetal atom (b) is not particularly limited as long as it is an atom of a nonmetal element. Examples of the nonmetal atom (b) include silicon, boron, carbon, and the like. Of these, silicon or carbon is preferred, and silicon is more preferred.

The nonmetal atom (b) may be included in the form of, for example, a nonmetal simple substance, a nonmetal oxide, a nonmetal nitride, a nonmetal oxynitride, a nonmetal carboxide, and the like.

Examples of the nonmetal simple substance include simple substances of nonmetals such as silicon, boron, carbon, and the like.

Examples of the nonmetal oxide include: silicon oxide; hydrolytic condensation products of a hydrolyzable silane, e.g., a tetraalkoxysilane such as tetraethoxysilane (TEOS); boron oxide; and the like.

Examples of the nonmetal nitride include silicon nitride, boron nitride, and the like.

Examples of the nonmetal oxynitride include silicon oxynitride, boron oxynitride, and the like.

Examples of the nonmetal carboxide include silicon carboxide (SiOC), and the like.

Of these, the nonmetal oxide is preferred; an oxide of silicon is more preferred; and silicon oxide is still more preferred.

The base (X) has preferably: the region (I), where the metal atom (a) is present on the surface layer; and the region (II), where the metal atom (a) is not present on the surface layer, and which consists of substantially only the nonmetal atom (b), more preferably: the region (I) including the metal simple substance; and the region (II) including the nonmetal oxide, and still more preferably: the region (I) including the copper simple substance; and the region (II) including silicon oxide.

A mode of the arrangement of the region (I) and the region (II) on the surface layer of the base (X) is not particularly limited, and is exemplified by surficial, spotted, striped, and other shapes in a planar view. The sizes of the region (I) and the region (II) are not particularly limited, and regions having a desired size may be provided as appropriate.

The shape of the base (X) is not particularly limited, and the base (X) may be made into a desired shape such as a plate shape as appropriate.

Coating Film-Forming Step

In this step, the coating film (P) containing the polymer (A) is formed on the surface of the region (I) on the base (X). The polymer (A) has the group (I) at an end of a main chain or a side chain thereof. The group (I) includes the functional group (A) that is capable of bonding to the atom (I) present on the surface layer of the region (I).

By this step, the coating film (P) containing the polymer (A) having the group (I) including the functional group (A) that is capable of bonding to the metal atom (a) is selectively formed on, for example, the surface of the region (I) including the metal atom (a) in the surface layer.

Coating Film (P)

The coating film (P) contains the polymer (A). The coating film (P) may also contain other component(s) besides the polymer (A).

Each component will be described in the following.

(A) Polymer

The polymer (A) has the group (I) at an end of a main chain or a side chain thereof. The "main chain" as referred to herein means a longest atom chain among atom chains constituting the polymer (A). The "side chain" as referred to herein means atom chains other than the main chain, among the atom chains constituting the polymer (A). In light of more improvement of regional selectivity of atom layer formation on the base surface, the polymer (A) has the group (I) preferably at the end(s) of the main chain, and more preferably at one end of the main chain.

Group (I)

The group (I) includes the functional group (A). The functional group (A) is capable of bonding to the atom (I) present on the surface layer of the region (I). This bond is, for example, a chemical bond, and is exemplified by a covalent bond, an ionic bond, a coordinate bond, a hydrogen bond, and the like. In the case in which atom (I) is the metal atom (a), in light of greater bonding strength between the metal atom and the functional group (A), the coordinate bond is preferred. In the case in which the atom (I) is the nonmetal atom (b), in light of greater bonding strength between the nonmetal atom and the functional group (A), the covalent bond or the hydrogen bond is preferred.

In the case in which the atom (I) is the metal atom (a), the functional group (A) is exemplified by a cyano group, a sulfanyl group, an ethylenic carbon-carbon double bond-containing group, an oxazoline ring-containing group, a phosphoric acid group, an epoxy group, a disulfide group, and the like. Of these, a cyano group or a sulfanyl group is preferred.

In the case in which the atom (I) is the nonmetal atom (b), examples of the functional group (A) include, as the functional group capable of forming a covalent bond or the like to a silicon atom, $-SiR_x(OR')_{3-x}$ and the like, wherein R and R' each independently represent a hydrogen atom or a monovalent hydrocarbon group having 1 to 20 carbon atoms; and x is an integer of 0 to 3. Furthermore, examples of the functional group (A) include, as the functional group capable of forming a hydrogen bond or the like with Si—OH, a group containing a nitrogen atom having an unshared electron pair, and the like. The nitrogen atom having the unshared electron pair is exemplified by a nitrogen atom to which one to three atoms other than a hydrogen atom bond via a single bond; a nitrogen atom in an aromatic heterocyclic group; and the like. Examples of the group containing the nitrogen atom include a primary amino group, a secondary amino group, a tertiary amino group, a nitrogen-containing aromatic heterocyclic group, and the like.

The polymer (A) is exemplified by a polymer having the group (I) at the end of the main chain (hereinafter, may be also referred to as "(A1) polymer" or "polymer (A1)"), a polymer having the group (I) at the end of the side chain (hereinafter, may be also referred to as "(A2) polymer" or "polymer (A2)"), and the like.

(A1) Polymer

The polymer (A1) has the group (I) at the end of the main chain. The group (I) that is capable of bonding to the end of the main chain of the polymer (A1) is exemplified by a group represented by the following formula (1) (hereinafter, may be also referred to as "group (I-1)"), and the like.

$$*-R^1-A^1 \qquad (1)$$

In the above formula (1), $A^1$ represents a monovalent functional group (A); $R^1$ represents a single bond, —O—, —S—, —NH— or a divalent organic group having 1 to 20 carbon atoms; and * denotes a site capable of bonding to the end of the main chain of the polymer (A1).

The divalent organic group having 1 to 20 carbon atoms which may be represented by $R^1$ is exemplified by: a divalent hydrocarbon group having 1 to 20 carbon atoms; a group including a divalent hetero atom-containing group between two adjacent carbon atoms of the divalent hydrocarbon group having 1 to 20 carbon atoms; a group obtained by substituting with a monovalent hetero atom-containing group, a part or all of hydrogen atoms of the divalent hydrocarbon group having 1 to 20 carbon atoms or the divalent hydrocarbon group having 1 to 20 carbon atoms including the divalent hetero atom-containing group; and the like.

The "hydrocarbon group" may involve a chain hydrocarbon group, an alicyclic hydrocarbon group or an aromatic hydrocarbon group. The "hydrocarbon group" may be a saturated hydrocarbon group or an unsaturated hydrocarbon group. The "chain hydrocarbon group" as referred to herein means a hydrocarbon group not having a ring structure but being constituted only from a chain structure, and involves both a linear hydrocarbon group and a branched hydrocarbon group. The "alicyclic hydrocarbon group" as referred to herein means a hydrocarbon group having as a ring structure not an aromatic ring structure but only an alicyclic structure, and involves both a monocyclic alicyclic hydrocarbon group and a polycyclic alicyclic hydrocarbon group. It is not necessary that the alicyclic hydrocarbon group be constituted from only the alicyclic structure, and a part thereof may also include a chain structure. The "aromatic hydrocarbon group" as referred to herein means a hydrocarbon group that includes an aromatic ring structure as the ring structure. It is not necessary that the aromatic hydrocarbon group be constituted from only the aromatic ring structure, and a part thereof may also include a chain structure and/or an alicyclic structure.

The divalent hydrocarbon group having 1 to 20 carbon atoms is exemplified by a divalent chain hydrocarbon group having 1 to 20 carbon atoms, a divalent alicyclic hydrocarbon group having 3 to 20 carbon atoms, a divalent aromatic hydrocarbon group having 6 to 20 carbon atoms, and the like.

Examples of the divalent chain hydrocarbon group having 1 to 20 carbon atoms include:

alkanediyl groups such as a methanediyl group, an ethanediyl group, a propanediyl group, and a butanediyl group;

alkenediyl groups such as an ethenediyl group, a propenediyl group, and a butenediyl group;

alkynediyl groups such as an ethynediyl group, a propynediyl group, and a butynediyl group; and the like.

Examples of the divalent alicyclic hydrocarbon group having 3 to 20 carbon atoms include:

monocyclic alicyclic saturated hydrocarbon groups such as a cyclopentanediyl group and a cyclohexanediyl group;

monocyclic alicyclic unsaturated hydrocarbon groups such as a cyclopentenediyl group and a cyclohexenediyl group;

polycyclic alicyclic saturated hydrocarbon groups such as a norbornanediyl group, an adamantanediyl group, and a tricyclodecanediyl group;

polycyclic alicyclic unsaturated hydrocarbon groups such as a norbornenediyl group and a tricyclodecenediyl group; and the like.

Examples of the divalent aromatic hydrocarbon group having 6 to 20 carbon atoms include:

arenediyl groups such as a benzenediyl group, a toluenediyl group, a xylenediyl group, a naphthalenediyl group, and an anthracenediyl group;

arenediylalkanediyl groups such as a benzenediylmethanediyl group, a benzenediylethanediyl group, a naphthalenediylmethanediyl group, and an anthracenediylmethanediyl group; and the like.

The hetero atom constituting the monovalent or divalent hetero atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, a group obtained by combining two or more of these, and the like, wherein R' represents a hydrogen atom or a monovalent hydrocarbon group.

Examples of the monovalent hetero atom-containing group include: halogen atoms such as a fluorine atom, a chlorine atom, a bromine atom, and an iodine atom; a hydroxy group; a carboxy group; a cyano group; an amino group; a sulfanyl group; and the like.

In the case in which the atom (I) is the metal atom (a), the group (I) in the polymer (A1) is exemplified by a cyanoalkyl group, a sulfanyl alkyl group, an alkenyl group, a benzoxazolyl alkyl group, a phosphonoalkyl group, an epoxyalkyl group, an alkyldisulfidealkyl group, and the like.

In the case in which the atom (I) is the nonmetal atom (b), the group (I) in the polymer (A1) is exemplified by a trimethoxysilylalkyl group, an aminoalkylsulfanyl group, a diaminoalkylsulfanyl group, a pyridylalkylsulfanyl group, and the like.

Structural Unit (I)

The polymer (A1) typically has in the main chain, a structural unit (hereinafter, may be also referred to as "structural unit (I)") derived from a monomer (hereinafter, may be also referred to as "monomer (I)"). The polymer (A1) may have one, or two or more types of the structural unit (I).

The monomer (I) is exemplified by a vinyl aromatic compound, (meth)acrylic acid or a (meth)acrylic acid ester, substituted or unsubstituted ethylene, and the like.

Examples of the vinyl aromatic compound include:
styrene;
substituted styrene such as α-methylstyrene, o-methylstyrene, m-methylstyrene, p-methylstyrene, p-t-butylstyrene, 2,4,6-trimethylstyrene, p-methoxystyrene, p-t-butoxystyrene, o-vinylstyrene, m-vinylstyrene, p-vinylstyrene, o-hydroxystyrene, m-hydroxystyrene, p-hydroxystyrene, m-chloromethylstyrene, p-chloromethylstyrene, p-chlorostyrene, p-bromostyrene, p-iodostyrene, p-nitrostyrene, and p-cyano styrene;
substituted or unsubstituted vinyl group-containing aromatic hydrocarbons such as vinylnaphthalene, methylvinylnaphthalene, and vinylpyrene; and the like.

Examples of the (meth)acrylic acid ester include:
(meth)acrylic acid alkyl esters such as methyl (meth)acrylate, ethyl (meth)acrylate, t-butyl (meth)acrylate, and 2-ethylhexyl (meth)acrylate;
(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate, and 2-(adamantan-1-yl)propyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate, and 3-trimethylsilylpropyl (meth)acrylate; and the like.

Examples of the substituted ethylene include:
alkenes such as propene, butene, and pentene;
vinylcycloalkanes such as vinylcyclopentane and vinylcyclohexane;
cycloalkenes such as cyclopentene and cyclohexene;
4-hydroxy-1-butene, vinyl glycidyl ether, vinyl trimethylsilyl ether, and the like.

In light of more improvement of blocking performance against thin-film formation using the vapor deposition procedure, the monomer (I) is preferably the vinyl aromatic compound, more preferably the substituted or unsubstituted styrene, and still more preferably unsubstituted styrene.

(A2) Polymer

The polymer (A2) has the group (I) at the end of the side chain. The polymer (A2) has, for example, a structural unit represented by the following formula (2) (hereinafter, may be also referred to as "structural unit (II)"). $A^2$-$R^2$— in the following formula (2) represents the group (I) at the end of the side chain. The polymer (A2) may have one, or two or more types of the structural unit (II).

(2)

In the above formula (2), $A^2$ represents a monovalent functional group (A); $R^2$ represents a single bond, —O—, —S—, —NH—, or a divalent organic group having 1 to 20 carbon atoms; and $R^3$ represents a hydrogen atom or a monovalent organic group having 1 to 10 carbon atoms.

The divalent organic group having 1 to 20 carbon atoms which may be represented by $R^2$ is exemplified by groups similar to the divalent organic group having 1 to 20 carbon atoms exemplified as $R^1$ in the above formula (1), and the like.

$R^2$ represents preferably a single bond, an oxyalkanediyl group or a carbonyloxyalkanediyl group.

The monovalent organic group having 1 to 20 carbon atoms which may be represented by $R^3$ is exemplified by divalent organic groups having 1 to 10 carbon atoms among the divalent organic groups having 1 to 20 carbon atoms to which one hydrogen atom has been added, exemplified as $R^1$ in the above formula (1), and the like.

In light of a degree of copolymerization of a monomer that gives the structural unit (II), $R^3$ represents preferably a hydrogen atom or a methyl group.

The lower limit of a proportion of the structural unit (II) contained with respect to the total structural units constituting the polymer (A2) is preferably 0.1 mol %, more preferably 1 mol %, and still more preferably 2 mol %. The upper limit of the proportion is preferably 30 mol %, more preferably 15 mol %, and still more preferably 10 mol %. The proportion of each structural unit contained in the polymer (A) may be determined by a $^{13}$C-NMR measurement on the polymer (A), followed by calculation from an area ratio of peaks corresponding to each structural unit in a resulting spectrum.

It is preferred that the structural unit (II) is aligned in a block. The polymer (A2) has the block of the structural unit (II) preferably at no less than one end part of the polymer, and more preferably at one end part of the polymer. When the polymer (A2) has the block of the structural unit (II) at one end part of the polymer, regional selectivity of the atom layer formation on the base surface can be more improved.

The polymer (A2) typically has, in addition to the structural unit (II), the structural unit (I) in the polymer (A1) described above. In a preferred structure of the polymer (A2), the block of the structural unit (II) bonds to one end of a molecular chain constituted with the structural unit (I). In this structure, the molecular chain may have one, or two or more types of the structural unit (I); alternatively, the molecular chain may have two or more types of the blocks of the structural unit (I), the blocks having different structures from each other.

The lower limit of a polystyrene equivalent weight average molecular weight (Mw) of the polymer (A) as determined by gel permeation chromatography (GPC) is preferably 1,000, more preferably 2,000, and still more preferably 3,000. The upper limit of the Mw is preferably 50,000, more preferably 30,000, and still more preferably 15,000.

The upper limit of a ratio (dispersity index) of the Mw to a polystyrene equivalent number average molecular weight (Mn) of the polymer (A) as determined by GPC is preferably 5, more preferably 2, still more preferably 1.5, and particularly preferably 1.2.

Herein, the Mw and the Mn of the polymer are values determined by using GPC under the following conditions.

GPC columns: GPC columns available from Tosoh Corporation ("G2000HXL"×2, "G3000HXL"×1, and "G4000HXL"×1);
eluent: tetrahydrofuran;
flow rate: 1.0 mL/min;
sample concentration: 1.0% by mass;
amount of injected sample: 100 μL;
column temperature: 40° C.;
detector: differential refractometer; and
standard substance: mono-dispersed polystyrene Synthesis Procedure of Polymer (A)

The polymer (A1) can be synthesized, for example, by: polymerizing a monomer that gives the structural unit (I) in an appropriate solvent through living anionic polymerization or the like; and thereafter, conducting a termination reaction of a polymerization end by using a chain-end terminator that provides the group (I), such as 3-bromopropionitrile or ethylene sulfide.

The polymer (A2) can be synthesized by, for example, polymerizing a monomer that gives the structural unit (I), a monomer that gives the structural unit (II) and the like in an appropriate solvent through anionic polymerization, cationic polymerization, radical polymerization or the like. Of these, in order to obtain the polymer having the block of the structural unit (II), anionic polymerization is preferred, and living anionic polymerization is more preferred.

Other Components

Other components which may be contained in the coating film (P) are exemplified by a surfactant, an acid generating agent, a base generating agent, a crosslinking agent, and the like.

The coating film-forming step specifically includes, for example, the steps of: applying a composition (hereinafter, may be also referred to as "composition (S)") containing the polymer (A) described above and a solvent (hereinafter, may be also referred to as "(B) solvent" or "solvent (B)") on an entirety of the surface of the base (X) (hereinafter, may be also referred to as "applying step"); and removing, by rinsing, a portion of the coating film (hereinafter, may be also referred to as "coating film (Q)") formed by the applying step on the regions (II) other than the regions (I) (hereinafter, may be also referred to as "rinsing-removing step").

It is preferred that the step of heating the base (X) after the applying step (hereinafter, may be also referred to as "heating step") is included before or after the rinsing-removing step.

Hereinafter, each step will be described.

Applying Step

In this step, the composition (S) is applied on an entirety of the surface of the base (X). The composition (S) contains the polymer (A) and the solvent (B). The composition (S) may also contain other component(s) in addition to the polymer (A) and the solvent (B).

The lower limit of a proportion of the polymer (A) contained with respect to total components other than the solvent (B) in the composition (S) is preferably 70% by mass, more preferably 80% by mass, and still more preferably 90% by mass. The proportion may be 100% by mass. One, or two or more types of the polymer (A) may be also used.

(B) Solvent

The solvent (B) is not particularly limited as long as it is a solvent capable of dissolving or dispersing at least the polymer (A) and the other component(s) which may be contained as needed.

The solvent (B) is exemplified by an alcohol solvent, an ether solvent, a ketone solvent, an amide solvent, an ester solvent, a hydrocarbon solvent, and the like.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partially etherated solvents having 3 to 19 carbon atoms such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole (methyl phenyl ether); and the like.

Examples of the ketone solvent include:
chain ketone solvents such as acetone, methyl ethyl ketone, methyl n-propyl ketone, methyl n-butyl ketone, diethyl ketone, methyl iso-butyl ketone (MIBK), methyl amyl ketone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as ethyl acetate and n-butyl acetate;

lactic acid ester solvents such as ethyl lactate and n-butyl lactate;

polyhydric alcohol carboxylate solvents such as propylene glycol acetate;

polyhydric alcohol partially etherated carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvents are preferred; the polyhydric alcohol partially etherated carboxylate solvent is more preferred; and propylene glycol monomethyl ether acetate is still more preferred. One, or two or more types of the solvent (B) may be employed.

Other Components

The other components which may be contained in the composition (S) are similar components to the other components which may be contained in the coating film (P), and the like.

Preparation Procedure of Composition

The composition (S) may be prepared, for example, by: mixing the polymer (A) and the solvent (B), as well as the other component(s) as needed, in a certain proportion; and preferably filtering a thus resulting mixture through a high density polyethylene filter or the like having fine pores of about 0.45 μm. The lower limit of the proportion of total components other than the solvent (B) contained in the composition (S) is preferably 0.1% by mass, more preferably 0.5% by mass, and still more preferably 1% by mass. The upper limit of the proportion is preferably 30% by mass, more preferably 10% by mass, and still more preferably 5% by mass.

Rinsing-Removing Step

In this step, the portion of the coating film (Q) formed by the applying step on the regions (II) other than the regions (I) is removed by rinsing. The coating film (Q) formed on the regions (II) to which the functional group (A) has not been bonded is detached and removed by rinsing.

For the rinsing, a solvent or the like is typically used. The solvent is exemplified by the solvents exemplified as the solvent (B) for the composition (S), and the like. The solvent is preferably the ester solvent, more preferably the polyhydric alcohol partially etherated carboxylate solvent, and still more preferably propylene glycol monomethyl ether acetate.

Heating Step

In this step, the base (X) after the applying step described above is heated (baked). By the heating, bonding between the atom (I) on the region (I) and the functional group (A) is considered to be promoted. This step may be carried out either before or after the rinsing-removing step, or before and after the rinsing-removing step. Of these, this step is preferably carried out before the rinsing-removing step.

For the heating procedure of the base (X), for example, a procedure of using an oven, a hot plate or the like may be exemplified. The lower limit of the heating temperature is preferably 80° C., more preferably 100° C., still more preferably 120° C., and particularly preferably 140° C. The upper limit of the heating temperature is preferably 400° C., more preferably 300° C., still more preferably 200° C., and particularly preferably 160° C. The lower limit of a time period of the heating is preferably 30 sec, more preferably 60 sec, and still more preferably 120 sec. The upper limit of the time period of the heating is preferably 120 min, more preferably 60 min, and still more preferably 10 min.

As described in the foregoing, the coating film (P) is formed on the surface of the region (I).

The lower limit of a static contact angle of water on the surface of the region (I) of the base (X) after the coating film-forming step is preferably 87°, more preferably 90°, still more preferably 95°, and particularly preferably 100°. The upper limit of the static contact angle is preferably 115°, and more preferably 110°.

Atom Layer-Forming Step

In this step, the atom layer (Y) is formed on the surface of the base (X) after the coating film-forming step by thin-film formation using the vapor deposition procedure.

By this step, the atom layer (Y) is selectively formed on the regions (II) other than the surface of the coating film (P), which is superior in blocking performance of thin-film formation, and is formed on the regions (I).

The vapor deposition procedure is a procedure in which a gas containing a material for a thin film is used, and a procedure of thin-film formation utilizing a chemical reaction in a gas phase is preferably employed.

The vapor deposition procedure is exemplified by an atomic layer deposition (ALD) procedure, a chemical vapor deposition (CVD) procedure, a physical vapor deposition (PVD) procedure, a pulse laser deposition (PLD) procedure, a molecular beam epitaxy (MBE) procedure, an ion plating procedure, and the like. Of these, the ALD procedure or the CVD procedure is preferred, and the ALD procedure is more preferred.

The CVD procedure is exemplified by thermal CVD, plasma CVD, photo CVD, vacuum CVD, laser CVD, organic metal CVD (MOCVD), and the like.

Examples of the ALD procedure include a thermal ALD procedure, a plasma ALD procedure, and the like.

The atom layer (Y) formed is exemplified by a metal layer, a metal oxide layer, a metal nitride layer, a nonmetal oxide layer, a nonmetal nitride layer, a metal-nonmetal oxide layer, a metal-nonmetal nitride layer, and the like.

Examples of the metal in/of the metal the layer include aluminum, zinc, hafnium, zirconium, titanium, tantalum, indium, ruthenium, copper, cobalt, tungsten, and the like.

Examples of the metal oxide in/of the metal oxide layer include aluminum oxide, zinc oxide, hafnium oxide, zirconium oxide, titanium oxide, tantalum oxide, hafnium-zirconium oxide, indium oxide, ruthenium oxide, and the like.

Examples of the metal nitride of the layer include titanium nitride, tantalum nitride, and the like.

Examples of the nonmetal oxide of the layer include silicon oxide, and the like.

Examples of the nonmetal nitride of the layer include silicon nitride, and the like.

Examples of the metal-nonmetal oxide of the layer include hafnium-silicon oxide, and the like.

Examples of the metal-nonmetal nitride of the layer include tantalum-carbon nitride, and the like.

The lower limit of an average thickness of the atom layer (Y) formed is preferably 0.1 nm, more preferably 1 nm, and still more preferably 2 nm. The upper limit of the average thickness is preferably 500 nm, more preferably 100 nm, and still more preferably 50 nm.

Etching-Removing Step

It is preferred that the pattern-forming method includes the etching-removing step in order to achieve higher regional selectivity.

In this step, on the base (X) after the atom layer-forming step, the coating film (P) and the atom layer (Y) formed on the surface of the coating film (P) are removed by etching. By this step, matter formed on the surface of the region (I) is eliminated.

The etching is exemplified by dry etching, wet etching, and the like. Of these, dry etching is preferred.

A procedure of the dry etching is exemplified by procedures in which a well-known dry etching apparatus is used, and the like. In addition, examples of a source gas for use in the dry etching include: fluorine-based gases such as $CHF_3$, $CF_4$, $C_2F_6$, $C_3F_8$, and $SF_6$; chlorine-based gases such as $Cl_2$ and $BCl_3$; oxygen-based gases such as $O_2$ and $O_3$; reductive gases such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, and $BCl_3$; inert gases such as He, $N_2$, and Ar; and the like. These gases may be used as a mixture. Of these, the oxygen gases are preferred.

As described above, the base having the atom layer formed thereon can be obtained conveniently with high regional selectivity.

EXAMPLES

Hereinafter, the present invention is explained in detail by way of Examples, but the present invention is not in any way limited to these Examples. Measuring methods for each of physical property values are shown below.

Molecular Weight

The Mw and the Mn of the polymer were measured by gel permeation chromatography (GPC) using GPC columns available from Tosoh Corporation ("G2000HXL"×2, "G3000HXL"×1, and "G4000HXL"×1), under the following conditions.

eluent: tetrahydrofuran (FUJIFILM Wako Pure Chemical Corporation);
flow rate: 1.0 mL/min;
sample concentration: 1.0% by mass;
amount of injected sample: 100 μL;
column temperature: 40° C.;
detector: differential refractometer; and
standard substance: mono-dispersed polystyrene Synthesis of Polymer (A)

Synthesis Example 1

After a 500-mL flask as a reaction vessel was dried under reduced pressure, 120 g of tetrahydrofuran (THF) which had been subjected to a dehydrating treatment by distillation in a nitrogen atmosphere was charged thereinto and cooled to −78° C. Next, 2.38 mL (2.30 mmol) of a 1 N cyclohexane solution of sec-butyllithium (sec-BuLi) was charged into this THF, and then 13.3 mL (0.115 mol) of styrene, which had been subjected to adsorptive filtration through silica gel for removing a polymerization inhibitor and to a dehydrating treatment by distillation, was charged by dropwise addition over 30 min, and the color of the polymerization system was ascertained to be orange. During the charging by dropwise addition, the internal temperature of the reaction mixture was carefully controlled so as not to be −60° C. or greater. After completion of the dropwise addition, aging was permitted for 30 min. Thereafter, 0.19 mL (2.30 mmol) of 3-bromopropionitrile was charged to conduct a terminating reaction of the polymerization end. The temperature of the reaction mixture was elevated to room temperature, and a resulting reaction mixture solution was concentrated and then substitution methyl isobutyl ketone (MIBK) was allowed. To a solution thus obtained, 1,000 g of a 2% by mass aqueous oxalic acid solution was charged, a resultant mixture was stirred and left to stand still, and then an aqueous underlayer was removed. This operation was repeated three times to remove a Li salt. Next, 1,000 g of ultrapure water was charged, a resultant mixture was stirred, and then an aqueous underlayer was removed. After this operation was repeated three times to remove oxalic acid, a solution thus obtained was concentrated and then dropped into 500 g of methanol to precipitate a polymer, and a solid was collected on a Buchner funnel. The solid was dried at 60° C. under reduced pressure, whereby 11.9 g of a white polymer represented by the following formula (A-1) was obtained. The polymer (A-1) had an Mw of 5,600, an Mn of 5,200, and an Mw/Mn of 1.08.

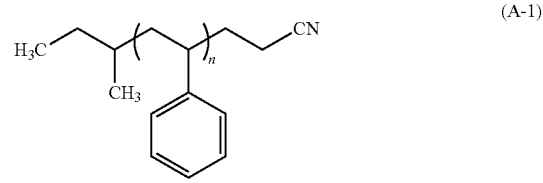

(A-1)

Synthesis Example 2

After a 500-mL flask as a reaction vessel was dried under reduced pressure, 120 g of THF which had been subjected to a dehydrating treatment by distillation in a nitrogen atmosphere was charged thereinto and cooled to −78° C. Next, 2.38 mL (2.31 mmol) of a 1 N cyclohexane solution of sec-butyllithium (sec-BuLi) was charged into this THF, and then 13.3 mL (0.115 mol) of styrene, which had been subjected to adsorptive filtration through silica gel for removing a polymerization inhibitor and to a dehydrating treatment by distillation, was charged by dropwise addition over 30 min, and the color of the polymerization system was ascertained to be orange. During the charging by dropwise addition, the internal temperature of the reaction mixture was carefully controlled so as not to be −60° C. or greater. After completion of the dropwise addition, aging was permitted for 30 min. Thereafter, 0.14 mL (2.31 mmol) of ethylene sulfide as a chain-end terminator, 1 mL of methanol and 0.3 g of p-methoxyphenol were added thereto to conduct a terminating reaction of the polymerization end. The temperature of the reaction mixture was elevated to room temperature, and a resulting reaction mixture solution was concentrated and then substitution methyl isobutyl ketone (MIBK) was allowed. To a solution thus obtained, 1,000 g of a 2% by mass aqueous oxalic acid solution was charged, a resultant mixture was stirred and left to stand still, and then an aqueous underlayer was removed. This operation was repeated three times to remove a Li salt. Next, 1,000 g of ultrapure water was charged, a resultant mixture was stirred, and then an aqueous underlayer was removed. After this operation was repeated three times to remove oxalic acid, a solution thus obtained was concentrated and then dropped into 500 g of methanol to precipitate a polymer, and a solid was collected on a Buchner funnel. The solid was dried at 60° C. under reduced pressure, whereby 11.0 g of a white polymer represented by the following formula (A-2) was obtained. The polymer (A-2) had an Mw of 5,300, an Mn of 5,100, and an Mw/Mn of 1.04.

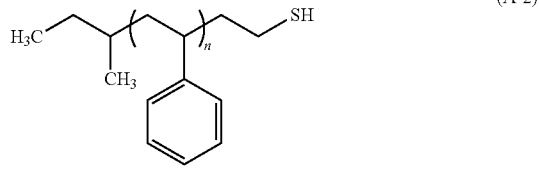

(A-2)

Preparation of Composition (S)

Each component used for preparing the composition (S) is presented below.

(A) Component

A-1: the polymer synthesized in Synthesis Example 1 above
A-2: the polymer synthesized in Synthesis Example 2 above
octadecyl phosphonic acid (ODPA): Sigma-Aldrich Co.

(B) Solvent

B-1: propylene glycol monomethyl ether acetate (PGMEA)
B-2: tert-butanol

Preparation Example 1

A composition (S-1) was prepared by: adding 97.0 g of (B-1) as the solvent (B) to 3.0 g of the polymer (A-1) as the component (A); stirring a mixture obtained; and filtering a thus resulting solution through a high density polyethylene filter having fine pores of 0.45 μm.

Preparation Example 2

A composition (S-2) was prepared by: adding 98.8 g of (B-1) as the solvent (B) to 1.2 g of the polymer (A-2) as the component (A); stirring a mixture obtained; and filtering a thus resulting solution through a high density polyethylene filter having fine pores of 0.45 μm.

Comparative Preparation Example 1

A composition (CS-1) was prepared by: adding 99.6 g of tert-butanol as the solvent (B) to 0.4 g of octadecyl phosphonic acid as the component (A); stirring a mixture obtained; and filtering a thus resulting solution through a high density polyethylene filter having fine pores of 0.45 μm.

As a base, typically, a substrate having silicon oxide region and a metal region of copper or the like is used. In the present Examples, a metal substrate and a silicon oxide substrate were used, and evaluations were made on each of the substrates.

Coating Film Formation: Production of Coating Film-Provided Base

Production Example 1

The composition (S-1) was spin-coated on a 2 cm² square copper substrate at 1,500 rpm and baked at 150° C. for 180 sec. Subsequently, rinsing with PGMEA removed ungrafted polymer on the surface of the substrate to produce a copper substrate (Cu-1).

Production Example 2

The composition (S-2) was spin-coated on a 2 cm² square copper substrate at 1,500 rpm and baked at baked at 150° C. for 180 sec. Subsequently, rinsing with PGMEA removed ungrafted polymer on the surface of the substrate to produce a copper substrate (Cu-2).

Comparative Production Example 1

A 2 cm² square copper substrate was immersed for 72 hrs in the composition (CS-1), which had been adjusted to have a temperature of 30° C., and thereafter the surface of the substrate was rinsed with methanol to produce a copper substrate (Cu-3).

Production Examples 3 and 4, and Comparative Production Example 2

Similar procedures to the Production Examples 1 and 2, and Comparative Production Example 1 described above were performed using a silicon oxide substrate to produce silicon oxide substrates (Si-1) to (Si-3).

Measurement of Static Contact Angle

Static contact angles of water on the surfaces of the copper substrates and the silicon oxide substrates produced as described above, and an untreated copper substrate and a silicon oxide substrate as standards were measured by using a contact angle scale ("Goniometer Model 400" available from Rame-Hart Instrument Company, LLC). The measurement results of the contact angles are shown in Table 1 below.

TABLE 1

| | Coating film-provided base | Contact angle |
|---|---|---|
| Production Example 1 | copper substrate (Cu-1) | 101° |
| Production Example 2 | copper substrate (Cu-2) | 100° |
| Comparative Production Example 1 | copper substrate (Cu-3) | 85° |
| Standard 1 | untreated copper substrate | 10° |
| Production Example 3 | silicon oxide substrate (Si-1) | 46° |
| Production Example 4 | silicon oxide substrate (Si-2) | 51° |
| Comparative Production Example 2 | silicon oxide substrate (Si-3) | 55° |
| Standard 2 | untreated silicon oxide substrate | 39° |

From the results shown in Table 1 above, it is revealed that when the composition (S-1) and the composition (S-2) were used, the coating film was selectively formed on the copper substrate. Although the coating film was more selectively formed on the copper substrate even in the case in which the composition (CS-1) was used, the composition (S-1) and the composition (S-2) exhibited results indicating better formability of the coating film and higher selectivity on the copper substrate.

Formation of Atom Layer: Formation of Hafnium Oxide Layer Using Atom Layer Deposition (ALD) Procedure Examples 1 and 2, and Comparative Example 1

Hafnium oxide layers were formed on the copper substrates (Cu-1) to (Cu 3) and the untreated copper substrate using tetrakis(dimethylamino)hafnium as a precursor, by using an ALD apparatus (Cambridge Nanotech Svannah).

Evaluation of Blocking Performance

Energy dispersive X-ray spectroscopy (EDX) was performed on the copper substrates (Cu-1) to (Cu-3) which had been subjected to the ALD, the amount of Hf vapor-deposited on the surface of each copper substrate was quantitatively determined, and then fluidity after moisture absorption (%) was calculated, with the amount of Hf vapor-deposited on the surface of the untreated copper substrate as a basis. The calculation equation is shown as the following formula (3).

[Fluidity after moisture absorption (%)]=[100−
(amount of Hf vapor-deposited on the surface
of each copper substrate/amount of Hf vapor-
deposited on the surface of the untreated copper
substrate)*100]   (3)

The results of the evaluations are shown in Table 2 below. A greater fluidity after moisture absorption indicates more superior ability by the ALD to inhibit formation of the hafnium oxide layer on the surface of the substrate.

TABLE 2

| | Coating film-provided base | Fluidity after moisture absorption (%) |
|---|---|---|
| Example 1 | copper substrate (Cu-1) | 77 |
| Example 2 | copper substrate (Cu-2) | 72 |
| Comparative Example 1 | copper substrate (Cu-3) | 44 |

As is seen from the results shown in Table 2 above, according to the pattern-forming methods of the Examples, it was possible to achieve more superior blocking performance against thin-film formation using the vapor deposition procedure, and higher regional selectivity, as compared with the Comparative Examples. In addition, according to the pattern-forming methods of the Examples, completion of the steps within a shorter period of time than the Comparative Examples was enabled. Consequently, the pattern-forming method of the embodiment of the present invention enables the atom layer to be formed on the base surface conveniently with higher regional selectivity.

The pattern-forming method according to the embodiment of the present invention enables an atom layer to be formed on a base surface conveniently with high regional selectivity. Therefore, the pattern-forming method can be suitably used for working processes of semiconductor devices, and the like, in which microfabrication is expected to be further in progress hereafter.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
    forming a patterned coating film on a part of a surface layer of a base, the surface layer comprising a plurality of regions, each region comprising a material that differs from each other, wherein the part of the surface layer, on which the patterned coating film is formed, is a part of the plurality of regions, the patterned coating film comprises a first polymer, and the first polymer comprises: a main chain which comprises a structural unit derived from at least one selected from the group consisting of a vinyl aromatic compound, a (meth) acrylic acid, and a (meth)acrylic acid ester; and at an end of a main chain or a side chain thereof, a group comprising a first functional group that is capable of bonding to an atom present in the part of the plurality of regions; and
    forming an atom layer directly or indirectly on the surface layer of the base by a vapor deposition, after the forming of the patterned coating film.

2. The pattern-forming method according to claim 1, wherein the plurality of regions comprise: a first region comprising a metal simple substance; and a second region comprising silicon oxide.

3. The pattern-forming method according to claim 1, wherein the first functional group in the first polymer is capable of bonding to a metal atom.

4. The pattern-forming method according to claim 1, further comprising after the forming of the atom layer,
    removing, by etching, the patterned coating film from the base together with the atom layer formed on the patterned coating film.

5. The pattern-forming method according to claim 1, wherein the forming of the patterned coating film comprises:

applying a composition comprising the first polymer and a solvent on an entirety of a surface of the surface layer of the base to form a coating film; and rinsing the base to remove a portion of the coating film formed on regions other than the part of the plurality of regions to form the patterned coating film.

6. The pattern-forming method according to claim 5, further comprising heating the base, after the forming of the coating film and before the rinsing of the base, or after the rinsing of the base.

7. The pattern-forming method according to claim 5, wherein the composition is applied on the surface by a spin coating.

8. The pattern-forming method according to claim 5, wherein a main chain of the first polymer comprises a structural unit derived from a vinyl aromatic compound.

9. The pattern-forming method according to claim 8, wherein the vinyl aromatic compound is a substituted or unsubstituted styrene.

10. The pattern-forming method according to claim 8, wherein the vinyl aromatic compound is an unsubstituted styrene.

11. The pattern-forming method according to claim 1, wherein the functional group is at least one selected from the group consisting of a cyano group, a sulfanyl group, an ethylenic carbon-carbon double bond-containing group, an oxazoline ring-containing group, a phosphoric acid group, an epoxy group, and a disulfide group.

12. The pattern-forming method according to claim 1, wherein the functional group is at least one selected from the group consisting of a cyano group and a sulfanyl group.

13. The pattern-forming method according to claim 1, wherein the vapor deposition is an atomic layer deposition.

14. The pattern-forming method according to claim 1, wherein a main chain of the first polymer comprises a structural unit derived from a vinyl aromatic compound.

15. The pattern-forming method according to claim 14, wherein the vinyl aromatic compound is a substituted or unsubstituted styrene.

16. The pattern-forming method according to claim 14, wherein the vinyl aromatic compound is an unsubstituted styrene.

17. The pattern-forming method according to claim 1, wherein the first polymer comprises, at the end of the main chain thereof, the group comprising a first functional group that is capable of bonding to an atom present in the part of the plurality of regions.

18. The pattern-forming method according to claim 1, wherein the first polymer comprises, at the end of the side chain thereof, the group comprising a first functional group that is capable of bonding to an atom present in the part of the plurality of regions.

* * * * *